United States Patent
Reznicek

(10) Patent No.: US 9,449,885 B1
(45) Date of Patent: Sep. 20, 2016

(54) HIGH GERMANIUM CONTENT FINFET DEVICES HAVING THE SAME CONTACT MATERIAL FOR NFET AND PFET DEVICES

(71) Applicant: International Business Machines Corporation, Armonk, NY (US)

(72) Inventor: Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/744,887

(22) Filed: Jun. 19, 2015

(51) Int. Cl.
H01L 21/00 (2006.01)
H01L 21/8238 (2006.01)
H01L 27/092 (2006.01)
H01L 29/161 (2006.01)
H01L 29/08 (2006.01)
H01L 29/78 (2006.01)
H01L 29/165 (2006.01)

(52) U.S. Cl.
CPC ......... H01L 21/823821 (2013.01); H01L 21/823814 (2013.01); H01L 21/823871 (2013.01); H01L 27/0924 (2013.01); H01L 29/0847 (2013.01); H01L 29/161 (2013.01); H01L 29/0843 (2013.01); H01L 29/165 (2013.01); H01L 29/7848 (2013.01)

(58) Field of Classification Search
CPC ........... H01L 21/823821; H01L 21/823871; H01L 21/823814; H01L 29/0843; H01L 29/0847; H01L 29/7848; H01L 29/165
See application file for complete search history.

(56) References Cited

U.S. PATENT DOCUMENTS

| | | | |
|---|---|---|---|
| 9,224,736 B1 * | 12/2015 | Ching | H01L 29/785 |
| 9,343,300 B1 * | 5/2016 | Jacob | H01L 21/02532 |
| 2010/0155790 A1 | 6/2010 | Lin et al. | |
| 2011/0108920 A1 * | 5/2011 | Basker | H01L 21/845 257/351 |
| 2012/0138928 A1 | 6/2012 | Martens et al. | |
| 2012/0153387 A1 | 6/2012 | Murthy et al. | |
| 2014/0117465 A1 | 5/2014 | Huang et al. | |
| 2014/0170839 A1 | 6/2014 | Brunco | |
| 2014/0361368 A1 | 12/2014 | Kerber et al. | |
| 2015/0035008 A1 | 2/2015 | Kittl et al. | |
| 2016/0042963 A1 * | 2/2016 | Kim | H01L 21/0262 438/507 |

OTHER PUBLICATIONS

Shayesteh et al., "NiGe Contacts and Junction Architectures for P and As Doped Germanium Devices", IEEE Transactions on Electron Devices, vol. 58, No. 11, pp. 3801-3807 (2011).
Hartmann et al., "Low temperature boron and phosphorous doped SiGe for recessed and raised sources and drains", Journal of Crystal Growth 327, pp. 68-77 (2011).

* cited by examiner

Primary Examiner — Nicholas Tobergte
(74) Attorney, Agent, or Firm — Daniel P. Morris; Otterstedt, Ellenbogen & Kammer, LLP

(57) ABSTRACT

FinFET structures are formed on silicon germanium fins having high germanium content. Silicon germanium source/drain regions formed in fin recesses in nFET regions are provided with arsenic or phosphorus-doped germanium caps. Uniform tensile strain is obtained through the use of ungraded silicon germanium in the n-type source/drain regions. Location of the germanium caps above the fin structure ensures they have no materially negative impact on strain. Boron doped germanium source/drain regions are formed in fin recesses in pFET regions and provide for compressive strain. Contact formation using the same material in both nFET and pFET regions of the same substrate facilitates fabrication.

20 Claims, 5 Drawing Sheets

HIGH GERMANIUM CONTENT FINFET DEVICES HAVING THE SAME CONTACT MATERIAL FOR NFET AND PFET DEVICES

FIELD

The present disclosure relates to the physical sciences, and, more particularly, to non-planar structures employed in FinFET devices and methods of fabrication thereof.

BACKGROUND

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

FinFET devices including silicon germanium fins enable improvements in performance with respect to silicon-based devices. Germanium content in the fins exceeding eighty-five percent (85%) has a band structure close to pure germanium. Channel materials including high germanium content offer potential for developing 7 nm and later nodes.

SUMMARY

Principles of the present disclosure provide an exemplary fabrication method that includes obtaining a structure comprising a substrate, a plurality of rows of parallel semiconductor fins on the substrate, the semiconductor fins having the composition $Si_{1-x}Ge_x$ where x is 0.85 or greater, a plurality of parallel gate structures on the substrate and extending across the rows of parallel semiconductor fins, and a plurality of spacers on the parallel gate structures, the structure having an nFET region and a pFET region. Recesses are formed within the semiconductor fins in the nFET and pFET regions. Epitaxial n-doped silicon germanium source/drain regions are grown in the recesses within the nFET region and n-doped cap layers of substantially pure germanium are deposited on the n-doped silicon germanium source/drain regions such that the n-doped cap layers extend above the recesses. P-doped source/drain regions of substantially pure germanium are epitaxially grown in the recesses within the pFET region. A metal contact layer is formed directly on the n-doped, substantially pure germanium cap layers and the p-doped, substantially pure germanium source/drain regions.

A semiconductor structure provided in accordance with the principles discussed herein includes a substrate and a plurality of rows of parallel semiconductor fins on the substrate, the semiconductor fins having the composition $Si_{1-x}Ge_x$ where x is 0.85 or greater. A plurality of parallel gate structures are on the substrate, extending across the rows of parallel semiconductor fins. Channel regions are beneath the gate structures. A plurality of spacers are on the parallel gate structures and a plurality of recesses are within the semiconductor fins, the recesses adjoining the channel regions. An nFET region includes a plurality of n-doped silicon germanium source/drain regions in the recesses and adjoining a plurality of the channel regions. A plurality of n-doped, substantially pure germanium caps on the n-doped silicon germanium source/drain regions extend above the recesses. A pFET region includes a plurality of p-doped, substantially pure germanium source/drain regions in the recesses. A metal contact layer directly contacts the n-doped, substantially pure germanium caps and the p-doped, substantially pure germanium source/drain regions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Finned structures, including devices made from such finned structures, and fabrication methods as disclosed herein can provide substantial beneficial technical effects. For example, one or more embodiments may provide one or more of the following advantages:

High channel mobility and current drive;
More uniform tensile strain than graded source/drain epitaxy;
Contact formation facilitated;
Integratable with FinFET CMOS process flow.

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. The exemplary processes discussed below are described with respect to fabrication of finned structures from bulk silicon substrates that can be subsequently processed to form electronic devices. The disclosed techniques can also be applied with respect to SOI substrates. FIGS. 1B-4 illustrate exemplary steps that may be performed sequentially in fabricating structures having fins with a high germanium content, it being appreciated that additional steps are employed in some embodiments to form structures such as source and drain regions and gate stacks. Fabrication may commence with a partially completed structure, in which case one or more of the steps described below could be omitted.

High germanium percentage SiGe or pure Ge fins need to be on bulk silicon or SOI substrates to work with current CMOS technology. Fins or nanowires could be formed from these materials. Source/drain and contact formation on such structures is challenging. Currently proposed structures includes pure boron-doped germanium for pFET and graded n-doped SiGe, starting with 70% SiGe and graded all way down to pure silicon, towards the contact surface. While the pFET proposal will work, the nFET proposal is very challenging to accomplish. Having fin heights of 40-60 nm with a recessed fin in the source drain region means one has to grade SiGe from 70% to 0% Ge within less than 50 nm, or more than 1% per nm, which will be hard to accomplish with the epitaxial growth behavior on fins. It will also lead to very defective material, especially at the top Si:P layer. Another challenge is to maintain the n-dopant concentration while grading the SiGe as phosphorus incorporation depends strongly on the germanium content of SiGe. Moreover, a graded nFET source drain epitaxy will lead to non-uniform strain distribution.

As discussed below, the techniques disclosed herein provide a novel way for nFET source/drain epitaxy on high percentage SiGe FinFET structures that will work well with pFET source/drain epitaxy of boron-doped germanium (Ge:B). The structures obtained, which include phosphorus doped germanium (Ge:P) capping structures, will exhibit more uniform tensile strain than a graded source drain epitaxy. Since the Ge:P caps are above the actual fin structure, they will have no negative impact on strain. Moreover, the caps can be a) amorphous and b) tailored to be completely consumed during contact formation. Such caps will also allow for easier contact formation, since the material to contact in both the nFET and pFET regions is the same semiconductor material, namely germanium.

Figure 1A:
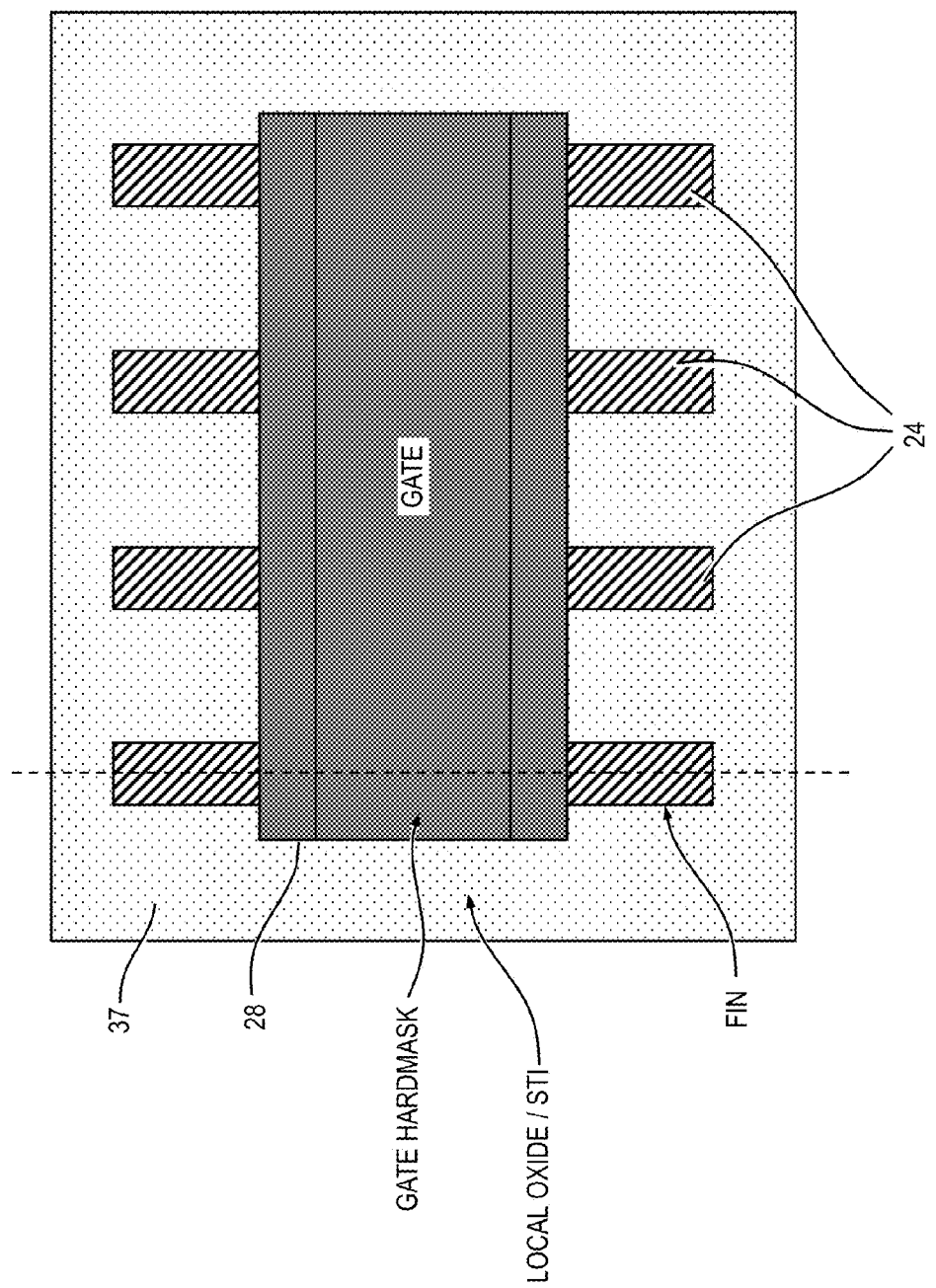
FIG. 1A is a top view of a structure including a silicon substrate, silicon germanium fins, and gate structure.
Figure 1B:
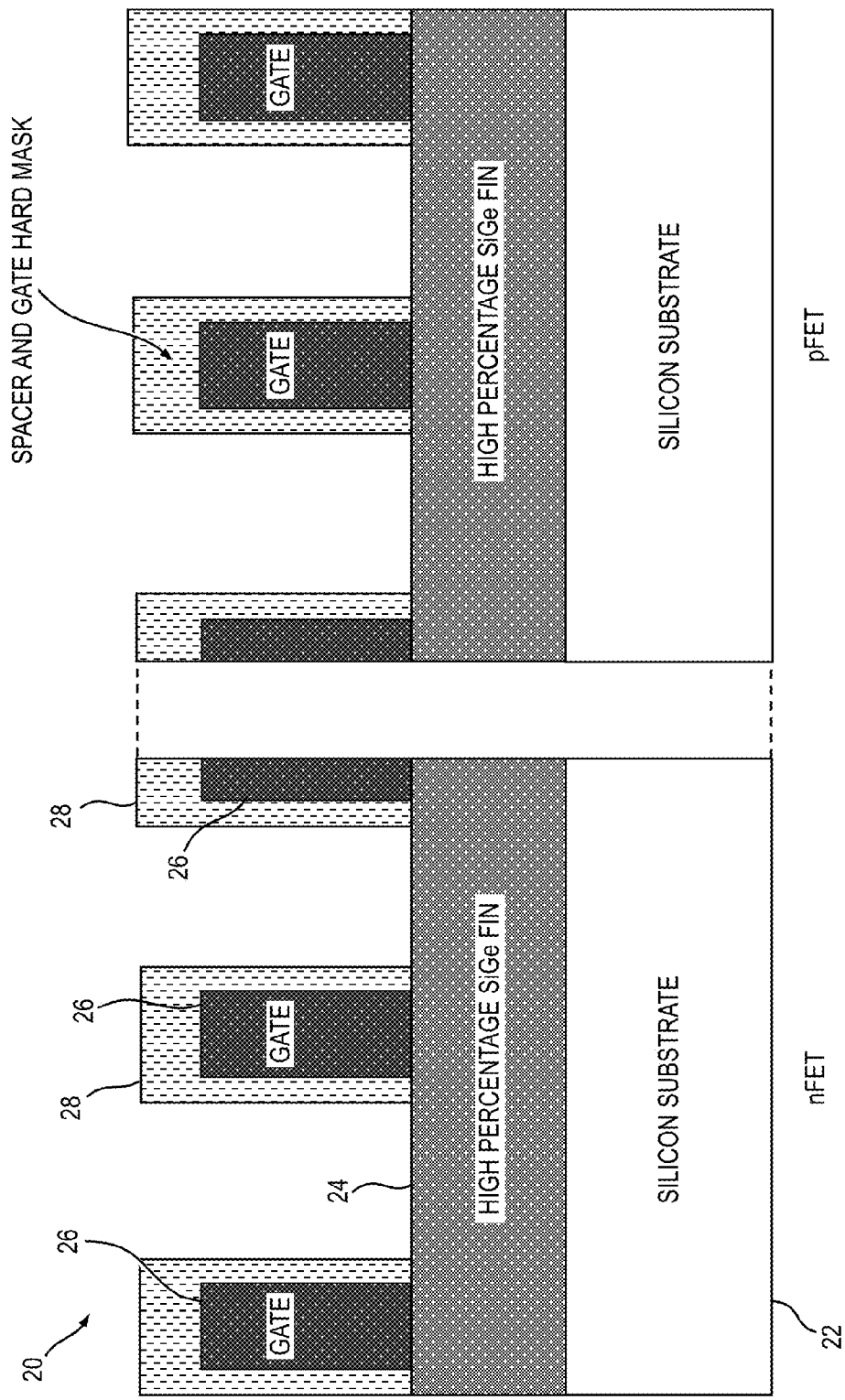
FIG. 1B is a schematic sectional illustration of the structure shown in FIG. 1A including further gate structures.

A structure 20 including a silicon substrate 22 consisting of essentially undoped crystalline silicon is employed for forming a finned structure as described hereafter, it being appreciated that standard silicon substrates may have a very low level of p-doping. The substrate may be in the form of a wafer. As shown in FIG. 1B, the structure 20 includes silicon germanium fins 24 having a high germanium content (at least 85%). Specifically, the fins 24 are $Si_{1-x}Ge_x$ where x is 0.85 or greater. Fin pitch is 25-50 nm and fin heights are 25-60 nm in one or more embodiments. A smaller pitch of 30-45 nm is employed in other embodiments. Fin width is six to ten nanometers (6-10 nm) in exemplary embodiments. Gate structures 26 are formed on the substrate 22. In some embodiments, the gate structures are dummy gates designed for later replacement. Alternatively, gate stacks including gate metal and gate dielectric layers are formed on the substrate 22. Spacers 28 are formed on the gate structures 26 and function as a hard mask. Silicon nitride ($Si_3N_4$) layer is deposited via CVD, PECVD, sputtering, or other suitable technique in some embodiments, forming the spacers 28. The gate structures and associated spacers protect the underlying portions of the SiGe fins 24 that later function as channel regions of FinFET devices.

Figure 2:
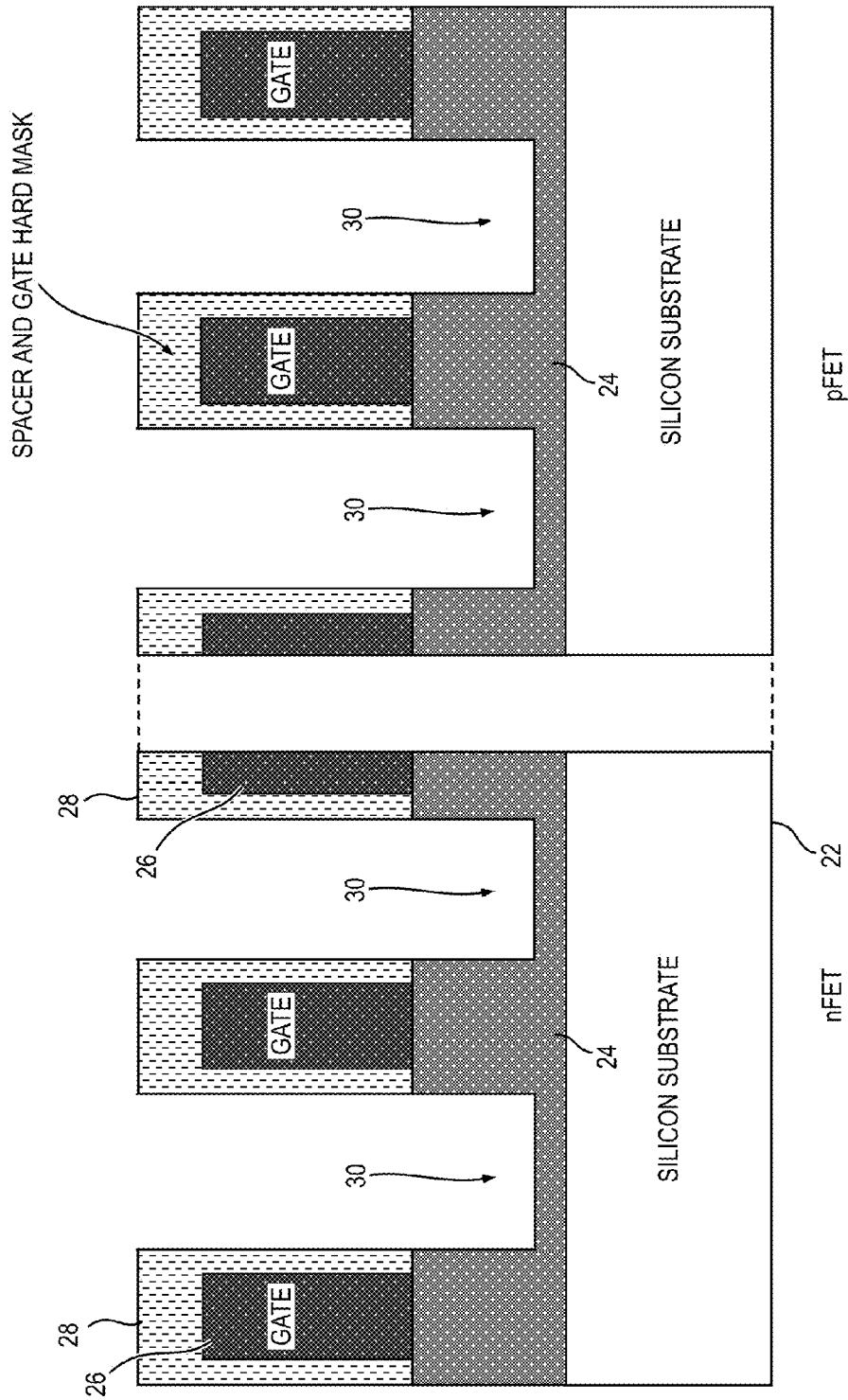
FIG. 2 is a schematic sectional illustration of the structure shown in FIG. 1B following recessing of the silicon germanium fins.

Referring to FIG. 2, the silicon germanium fins are selectively etched to form recesses 30 in the source/drain regions. The silicon germanium fins are subjected to reactive ion etch (RIE) to remove the portions between the gate structures in some embodiments. The etch is discontinued prior to reaching the silicon substrate 22, leaving portions of the silicon germanium fins 24 in the source/drain regions. In embodiments where the fin heights are 30-60 nm, the recesses 30 are, for example, 25-50 nm deep.

Figure 3:
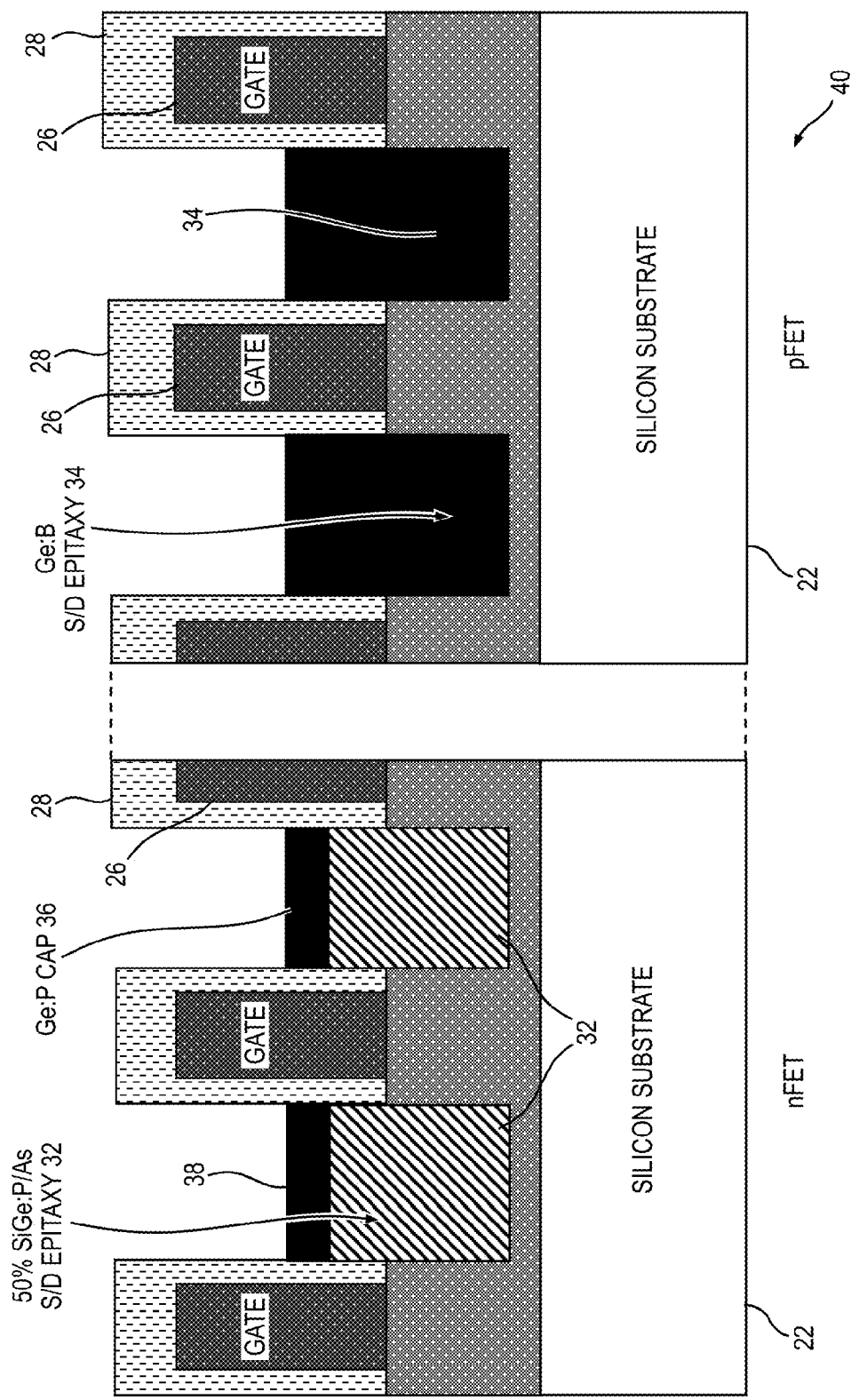
FIG. 3 is a schematic sectional illustration of the structure shown in FIG. 2 following source/drain epitaxy and the formation of germanium caps.

Source/drain regions 32, 34 are grown epitaxially within the recesses 30. In the nFET region of the structure, n-doped silicon germanium forms the source/drain regions. In an exemplary embodiment, the germanium content of the deposited material is fifty percent (50%) and the n-type dopant is phosphorus or arsenic. Exemplary epitaxial growth processes that are suitable for use in forming the silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. Although higher temperature typically results in faster deposition, the faster deposition may result in crystal defects and film cracking. The silicon germanium layer source/drain regions 32 can, for example, consist essentially of n-doped $Si_{1-y}Ge_y$ with y=0.5. The proportion of germanium to silicon of the silicon germanium source/drain regions 32 is less than that in the silicon germanium fins 24. The germanium and silicon precursors (e.g. germane and silane) are introduced in the proper ratios to obtain the targeted germanium content of the source/drain regions 32. The n-type source/drain regions 32 extend at least to the top surface of the fins 24 and extend above the fins in some embodiments, as shown in FIG. 3. Deposition of the n-type source/drain material is selective to the exposed areas of the silicon germanium fins 24. The source/drain material does not grow in the regions between fins, which include a local oxide layer 37 as shown in FIG. 1A. The ratio of silicon and germanium precursors (e.g. silane and germane) is maintained constant during deposition to provide a substantially uniform ratio of silicon to germanium. Unlike graded silicon germanium deposits, the ungraded source/drain regions 32 provide uniform tensile strain in the nFET region. Phosphorus-doped germanium caps 36 are deposited on the source/drain regions 32 in some embodiments. The epitaxial process used to grow the source/drain regions 32 may be continued by using only germane and phosphine precursor as dopant. In other words, the caps are formed using the same epitaxial growth process as used for forming the underlying strain-inducing layer. The growth of the underlying layer is stopped, gases and temperature are adjusted, and the caps 36 are grown. The wafers do not have to leave the epitaxy chamber. During nFET epitaxy, pFET regions are blocked and vice versa. In one or more exemplary embodiments, the cap thickness is between five and twenty-five nanometers (5-25 nm). As discussed above, the caps 36 will not have a negative impact on strain as they are formed above the recesses 30 and therefore above the actual fin structure. In some embodiments, the n-doped germanium material forming the caps 36 is amorphous. The pFET region of the structure is masked while the n-type source/drain regions 32 and germanium caps 36 are formed in the nFET region. In embodiments where the source/drain regions 32 are formed first in the nFET region of the structure, the mask protecting the pFET region is removed and a new mask (not shown) is deposited on the completed nFET region. Source/ drain epitaxy is then conducted in the pFET region to form the p-doped source/drain regions 34. The p-doped source/drain regions consist essentially of boron-doped germanium in one or more exemplary embodiments. Compressive strain, which is desirable in pFET devices to enhance carrier mobility, is provided in the pFET region through the use of substantially pure germanium, i.e. p-doped pure germanium or p-doped silicon germanium having the composition $Si_{1-z}Ge_z$ where z is 0.98 or greater. The p-doped source/drain regions 34 include cap regions that extend outside the recesses 30 and above the fins 24, as shown in FIG. 3. The resulting structure 40 accordingly includes exposed surfaces 38 consisting essentially of substantially pure germanium, the germanium being phosphorus or arsenic doped in the nFET region and boron-doped in the pFET region. In some embodiments, the cap regions formed on the p-doped source/drain regions 34 have higher doping levels than the remainders of the structures to promote better contact formation. In embodiments where the n-type and/or p-type cap regions are amorphous, the cap thickness should be such that the contact forming process (germanization) consumes all of the amorphous material.

Figure 4:
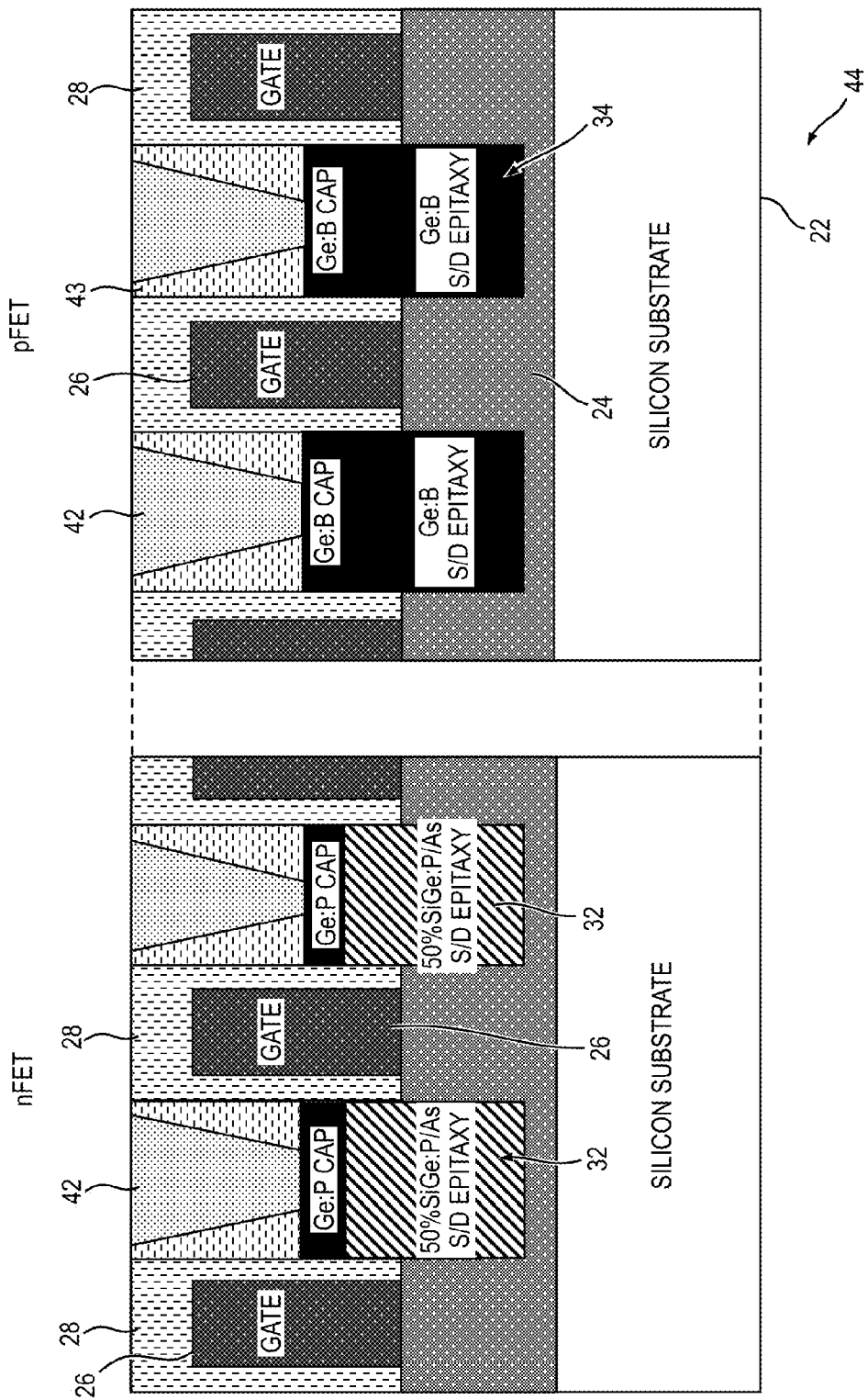
FIG. 4 is a schematic sectional illustration of the structure shown in FIG. 3 following formation of contacts on the germanium caps.

Referring to FIG. 4, metal contact structures 42 and an inter layer dielectric (ILD) layer 43 are deposited on the germanium surfaces of the source/drain regions 32, 34. The ILD layer may or may not be deposited on both sides if self-aligned contacts (SAC) are used, such as in 7 nm nodes. The metal contacts substantially increase the contact area, as known in the art, thereby reducing the contact resistance and overall access resistance to the FinFET devices obtained. In one or more embodiments, a metal such as nickel (Ni), titanium (Ti), titanium nitride (TiN), or tungsten (W) is deposited. Electroless deposition processes and atomic layer deposition (ALD) are among the techniques that may be employed. The germanium surfaces may be cleaned prior to metal deposition if necessary to remove oxides or other residues. Metal deposition may be followed by annealing at temperatures between 150-450° C., with 200-400° C. annealing temperatures preferred in some embodiments.

Given the discussion thus far and with reference to the exemplary embodiments discussed above and the drawings, it will be appreciated that, in general terms, an exemplary fabrication method includes obtaining a structure 20 comprising a substrate 22, a plurality of rows of parallel semiconductor fins 24 on the substrate, the semiconductor fins having the composition $Si_{1-x}Ge_x$ where x is 0.85 or greater, a plurality of parallel gate structures 26 on the substrate and extending across the rows of parallel semiconductor fins 24, and a plurality of spacers 28 on the parallel gate structures. The structure has an nFET region and a pFET region, the former to contain nFET devices and the latter to contain pFET devices. Recesses 30 are formed within the semiconductor fins in the nFET and pFET regions, as schematically illustrated in FIG. 2. As shown in FIG. 3, n-doped silicon germanium source/drain regions 32 are epitaxially grown in the recesses within the nFET region and n-doped, substantially pure germanium cap layers are grown on the n-doped silicon germanium source/drain regions such that the cap layers extend above the recesses 30. As further shown in FIG. 3, p-doped, substantially pure germanium source/drain regions 34 are epitaxially grown in the recesses 30 within the pFET region. The source/drain regions 32, 34 are operatively associated with the silicon germanium channel regions beneath the gates 26. A metal contact layer 42 is formed directly on the n-doped, substantially pure germanium cap layers and the p-doped, pure germanium source/drain regions. The contact layer can be applied as a single step as the material to be contacted is the same in both the nFET and pFET regions. The n-doped silicon germanium source/drain regions 32 are ungraded in one or more embodiments to provide more uniform tensile strain than is obtained when graded regions are formed. The step of forming the recesses further includes etching partially through the semiconductor fins rather than entirely therethrough. The n-doped, substantially pure germanium cap layers that form the caps 36 are doped with phosphorus or arsenic and the p-doped, substantially pure germanium source/drain regions are doped with boron in some embodiments. The n-doped, substantially pure germanium cap layers that form the caps 36 are deposited entirely above the recesses within the semiconductor fins in one or more embodiments. The p-doped, substantially pure germanium source drain regions 34 include cap regions having higher doping levels than the remainder of the source/drain regions 34 in some embodiments. The cap regions extend above the recesses 30 within the fins.

An exemplary finned structure includes a substrate 22, a plurality of rows of parallel semiconductor fins 24 on the substrate, the semiconductor fins having the composition $Si_{1-x}Ge_x$ where x is 0.85 or greater, and a plurality of parallel gate structures 26 on the substrate and extending across the rows of parallel semiconductor fins. The fins include channel regions beneath the gate structures. The gate structures are covered by dielectric spacers. The semiconductor fins include recesses 30 adjoining the channel regions. An nFET region includes n-doped silicon germanium source/drain regions 32 in the recesses and adjoining the channel regions. Pure germanium, n-doped caps 36 are on the n-doped silicon germanium source/drain regions and extend above the recesses. A pFET region includes p-doped, pure germanium source/drain regions 34 in the recesses. A metal contact layer 42 directly contacts the n-doped, pure germanium caps 36 and the p-doped, pure germanium source/drain regions 34. The n-doped silicon germanium source/drain regions 32 are ungraded and consist essentially of ungraded $Si_{1-y}Ge_y$ where y is less than x in some embodiments. In one exemplary embodiment, y=0.50. The recesses 30 may extend partially, but not entirely through the semiconductor fins and the n-doped, pure germanium caps 36 may be positioned entirely above the recesses within the semiconductor fins, as shown in FIG. 3. The p-doped, pure germanium source/drain regions 34 extend above the recesses 30 and are doped with boron in some embodiments.

Those skilled in the art will appreciate that the exemplary structures discussed above can be distributed in raw form or incorporated as parts of intermediate products or end products such as integrated circuits that benefit from having non-planar electronic devices such as FinFETs therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
obtaining a structure comprising a substrate, a plurality of rows of parallel semiconductor fins on the substrate, the semiconductor fins having the composition $Si_{1-x}Ge_x$ where x is 0.85 or greater, a plurality of parallel gate structures on the substrate and extending across the rows of parallel semiconductor fins, and a plurality of spacers on the parallel gate structures, the structure having an nFET region and a pFET region;
forming recesses within the semiconductor fins in the nFET and pFET regions;
epitaxially growing n-doped silicon germanium source/drain regions in the recesses within the nFET region;
depositing n-doped cap layers of substantially pure germanium on the n-doped silicon germanium source/drain regions such that the n-doped cap layers extend above the recesses;
epitaxially growing p-doped source/drain regions of substantially pure germanium in the recesses within the pFET region, and
forming a metal contact layer directly on the n-doped, substantially pure germanium cap layers and the p-doped, substantially pure germanium source/drain regions.

2. The method of claim 1, wherein the n-doped silicon germanium source/drain regions are ungraded.

3. The method of claim 1, wherein the step of forming the recesses further includes etching partially through the semiconductor fins.

4. The method of claim 3, wherein the n-doped silicon germanium source/drain regions consist essentially of ungraded $Si_{1-y}Ge_y$ where y is less than x.

5. The method of claim 4, wherein the substrate comprises monocrystalline silicon.

6. The method of claim 4, wherein the n-doped, substantially pure germanium cap layers are doped with arsenic or phosphorus.

7. The method of claim 4, wherein the p-doped, substantially pure germanium source/drain regions are doped with boron.

8. The method of claim 4, wherein:
the step of epitaxially growing the n-doped silicon germanium source/drain regions further includes growing the n-doped silicon germanium source/drain regions above the recesses.

9. The method of claim 8, wherein:
the step of epitaxially growing the p-doped, substantially pure germanium source/drain regions further includes growing p-doped, substantially pure germanium cap regions of the p-doped, pure germanium source/drain regions above the recesses.

10. The method of claim 9, wherein the n-doped, substantially pure germanium cap layers are doped with phosphorus or arsenic and the p-doped, substantially pure germanium source/drain regions are doped with boron.

11. The method of claim 10, wherein the metal contact layer is formed simultaneously on the n-doped, pure germanium cap layers and the p-doped, substantially pure germanium cap regions of the p-doped, substantially pure germanium source/drain regions.

12. The method of claim 10, wherein the n-doped, substantially pure germanium cap layers are deposited entirely above the recesses within the semiconductor fins.

13. A semiconductor structure comprising:
a substrate;
a plurality of rows of parallel semiconductor fins on the substrate, the semiconductor fins having the composition $Si_{1-x}Ge_x$ where x is 0.85 or greater
a plurality of parallel gate structures on the substrate and extending across the rows of parallel semiconductor fins;
a plurality of channel regions beneath the gate structures;
a plurality of spacers on the parallel gate structures;
a plurality of recesses within the semiconductor fins, the recesses adjoining the channel regions;
an nFET region including a plurality of n-doped silicon germanium source/drain regions in the recesses and adjoining a plurality of the channel regions;
a plurality of n-doped, substantially pure germanium caps on the n-doped silicon germanium source/drain regions and extending above the recesses;
a pFET region including a plurality of p-doped, substantially pure germanium source/drain regions in the recesses, and
a metal contact layer directly contacting the n-doped, substantially pure germanium caps and the p-doped, substantially pure germanium source/drain regions.

14. The semiconductor structure of claim 13, wherein the n-doped silicon germanium source/drain regions are ungraded.

15. The semiconductor structure of claim 14, wherein the n-doped silicon germanium source/drain regions consist essentially of ungraded $Si_{1-y}Ge_y$ where y is less than x.

16. The semiconductor structure of claim 15, wherein the n-doped, substantially pure germanium caps are doped with phosphorus or arsenic.

17. The semiconductor structure of claim 16, wherein the recesses extend partially through the semiconductor fins and the n-doped, substantially pure germanium caps are positioned entirely above the recesses within the semiconductor fins.

18. The semiconductor structure of claim 17, wherein the p-doped, substantially pure germanium source/drain regions include substantially pure germanium cap regions that extend above the recesses and are doped with boron.

19. The semiconductor structure of claim 18, wherein the metal contact layer consists essentially of a single material.

20. The semiconductor structure of claim 19, wherein the metal contact layer is selected from the group consisting of nickel, titanium, titanium nitride and tungsten.

* * * * *